United States Patent
Li et al.

(10) Patent No.: US 9,806,109 B2
(45) Date of Patent: Oct. 31, 2017

(54) HALF TONE MASK PLATE AND METHOD FOR MANUFACTURING ARRAY SUBSTRATE USING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/490,814

(22) Filed: Sep. 19, 2014

(65) Prior Publication Data

US 2015/0270297 A1    Sep. 24, 2015

(30) Foreign Application Priority Data

Mar. 20, 2014   (CN) .......................... 2014 1 0104455

(51) Int. Cl.
*H01L 27/14* (2006.01)
*H01L 27/12* (2006.01)
(Continued)

(52) U.S. Cl.
CPC ............ *H01L 27/1288* (2013.01); *G03F 1/00* (2013.01); *H01L 21/0274* (2013.01); *H01L 21/32139* (2013.01)

(58) Field of Classification Search
CPC ... H01L 27/12; H01L 21/311; H01L 21/3213; H01L 21/027; G03F 1/32
(Continued)

(56) References Cited

U.S. PATENT DOCUMENTS 6,835,504 B2 *  12/2004  Chang ..................... G03F 1/144
                                                                430/5
7,531,394 B2     5/2009   Long et al.
(Continued)

FOREIGN PATENT DOCUMENTS

CN       101093844 A     12/2007
CN       101494201 A      7/2009
(Continued)

OTHER PUBLICATIONS

First Chinese Office Action regarding Application No. 2014101044558 dated Jun. 20, 2016. Translation provided by Dragon Intellectual Property Law Firm.
(Continued)

*Primary Examiner* — Caleb Henry
(74) *Attorney, Agent, or Firm* — Harness, Dickey & Pierce, P.L.C.

(57) ABSTRACT

The present disclosure provides a half tone mask plate used to manufacture an active layer pattern as well as a source electrode pattern, a drain electrode pattern and a data line pattern located on the active layer pattern included in the array substrate. A surface of the array substrate includes a first region corresponding to the source electrode pattern, the drain electrode pattern and the data line pattern, a second region corresponding to a region of the active layer pattern located between the source electrode pattern and the drain electrode pattern, as well as a third region in addition to the first region and the second region; the half tone mask plate
(Continued)

includes a semi-transparent region corresponding to the second region and a partial region of the third region.

6 Claims, 11 Drawing Sheets

(51) Int. Cl.
 *H01L 21/027* (2006.01)
 *H01L 21/3213* (2006.01)
 *G03F 1/00* (2012.01)
(58) Field of Classification Search
 USPC .......................................................... 257/72
 See application file for complete search history.

(56) References Cited

U.S. PATENT DOCUMENTS

| | | | |
|---|---|---|---|
| 8,298,728 B2* | 10/2012 | Piao | G03F 1/144 |
| | | | 430/5 |
| 2010/0230679 A1* | 9/2010 | Kim | G02F 1/136227 |
| | | | 257/59 |
| 2011/0007234 A1* | 1/2011 | Liu | H01L 27/1214 |
| | | | 349/43 |
| 2012/0161137 A1* | 6/2012 | Lee | H01L 27/1255 |
| | | | 257/59 |
| 2012/0302016 A1* | 11/2012 | Ma | H01L 27/1288 |
| | | | 438/197 |
| 2013/0240916 A1* | 9/2013 | Choi | H01L 27/156 |
| | | | 257/88 |
| 2014/0077207 A1* | 3/2014 | Gao | G02F 1/1368 |
| | | | 257/43 |
| 2014/0293182 A1* | 10/2014 | Kim | G02F 1/136209 |
| | | | 349/43 |

FOREIGN PATENT DOCUMENTS

| | | |
|---|---|---|
| CN | 101656232 A | 2/2010 |
| CN | 101807549 A | 8/2010 |
| CN | 103199060 A | 7/2013 |
| JP | 2008003610 A | 1/2008 |

OTHER PUBLICATIONS

Second Office Action regarding Chinese application No. 201410104455.8, dated Dec. 9, 2016. Translation provided by Dragon Intellectual Property Law Firm.

\* cited by examiner

HALF TONE MASK PLATE AND METHOD FOR MANUFACTURING ARRAY SUBSTRATE USING THE SAME

CROSS-REFERENCE TO RELATED APPLICATION

This application claims priority to Chinese Patent Application No. 201410104455.8 filed on Mar. 20, 2014, the disclosures of which are incorporated in their entirety by reference herein.

TECHNICAL FIELD

The present disclosure relates to the field of display technology, and more particularly to a half tone mask plate, an array substrate and a method for manufacturing the same as well as a display apparatus.

BACKGROUND

A 4mask (i.e., four-time mask patterning) process currently adopted for manufacturing an array substrate includes: a Gate Mask process (i.e., a mask patterning process for gate electrodes and gate lines of the array substrate), an SDT Mask process (i.e., a mask patterning process for an active layer of the array substrate as well as source electrodes, drain electrodes and data lines located on the active layer), a PVX Mask process (i.e., a mask patterning process for via holes of the array substrate), and an ITO Mask process (i.e., a mask patterning process for pixel electrodes of the array substrate).

A mask plate which is currently adopted in the SDT Mask process is a half tone mask plate. A specific structure of a current half tone mask plate is generally shown in FIG. 1. The half tone mask plate 00 includes a totally light shielding region a, a semi-transparent region b and a totally light transmitting region c. When the half tone mask plate is used to form an active layer as well as source electrodes, drain electrodes and data lines located on the active layer by performing one time SDT Mask process on a semiconductor layer and a metal layer which are sequentially stacked, the totally light shielding region of the half tone mask plate corresponds to a source electrode region, a drain electrode region and a data line region; the semi-transparent region of the half tone mask plate corresponds to a region of the active layer located between the source electrode region and the drain electrode region; and a region of the metal layer except for regions of the metal layer which correspond to the totally light shielding region and the semi-transparent region of the half tone mask plate corresponds to the totally light transmitting region of the half tone mask plate, so as to respectively etch the semiconductor layer and the metal layer in the totally light transmitting region of the half tone mask plate as well as the metal layer in the semi-transparent region of the half tone mask plate, and remain the semiconductor layer and the metal layer in the totally light shielding region of the half tone mask plate to form the active layer, the source electrodes, the drain electrodes and the data lines.

As shown in FIG. 1, after using the half tone mask plate 00 to expose (i.e., light 400 passes through the half tone mask plate 00 and irradiate on photoresist) and develop photoresist on the metal layer 300, some photoresist 100b is remained on the metal layer 30 in the semi-transparent region b of the half tone mask plate 00. Thus, before etching the metal layer in the semi-transparent region of the half tone mask plate, it is needed to remove the photoresist remained on the metal layer in the semi-transparent region of the half tone mask plate through an ashing process in advance. Since a dry etching equipment has a function of ashing and removing the photoresist, thus, at present, in order to simplify the processes, a dry etching method is generally used to etch the metal layer in the semi-transparent region of the half tone mask plate. However, since some materials which are not easily volatile and not inconvenient to be removed can be produced in the dry etching process, thus, a partial concentration of etching plasma is affected, resulting in poor uniformity of the etching. This can easily lead to occurrence of problems that the metal layer in the semi-transparent region of the half tone mask plate is remained or over-etched, resulting in that manufactured thin film transistors (TFT) of the array substrate have poor performance and then the final manufactured array substrate has poor quality.

From the above, as present, when the dry etching method is used to etch the metal layer in the semi-transparent region of the half tone mask plate, since the uniformity of the etching is poor, thus the manufactured TFT have poor performance and then the final manufactured array substrate has poor quality.

SUMMARY

Embodiments of the present disclosure provide a half tone mask plate, an array substrate and a method for manufacturing the same as well as a display apparatus, which are to solve problems in the prior art that when the dry etching method is used to etch the metal layer in the semi-transparent region of the half tone mask plate, the manufactured thin film transistors (TFT) have poor performance due to the poor etching uniformity, and then the final manufactured array substrate has a poor quality.

In a first aspect, one embodiment of the present disclosure provides a half tone mask plate used to manufacture an active layer pattern as well as a source electrode pattern, a drain electrode pattern and a data line pattern located on the active layer pattern included in an array substrate, wherein a surface of the array substrate includes a first region corresponding to the source electrode pattern, the drain electrode pattern and the data line pattern, a second region corresponding to a region of the active layer pattern located between the source electrode pattern and the drain electrode pattern, as well as a third region in addition to the first region and the second region, the half tone mask plate comprising: a semi-transparent region corresponding to the second region and a partial region of the third region.

The half tone mask plate includes a semi-transparent region corresponding to a partial region of the third region and the second region.

In one embodiment of the present disclosure, the semi-transparent region of the half tone mask plate corresponds to not only the second region, but also the partial region of the third region; thus, after using the half tone mask plate to expose and develop photoresist on etched material, some photoresist is remained on the etched material in both of the partial region of the third region and the second region; after removing the remained photoresist through an ashing process, the etched material in both of the partial region of the third region and the second region are exposed.

Comparing with the prior art, when the dry etching method is used to etch the etched material in the semi-transparent region of the half tone mask plate, not only the exposed etched material in the second region contacts etching plasma generated by a dry etching equipment, but also the exposed etched material in the partial region of the third region contacts the etching plasma, i.e., a contact area between the etched material and the etching plasma is increased. Thus, a rate of etching the etched material in the partial region of the third region and the second region is reduced, and the uniformity of etching the etched material in the partial region of the third region and the second region is improved. This can reduce or avoid in a certain extent occurrence of problems that the etched material in the semi-transparent region of the half tone mask plate is remained or over-etched, improve the performance of the manufactured TFT and the quality of the final manufactured array substrate.

Optionally, the semi-transparent region of the half tone mask plate corresponds to any partial region of the third region.

Optionally, the semi-transparent region of the half tone mask plate corresponds to at least one independent region of the third region.

Optionally, the semi-transparent region of the half tone mask plate corresponds to a partial or entire region of the third region except for a pixel display region.

In one embodiment of the present disclosure, this can avoid producing negative impact on display of a display apparatus manufactured by using the half tone mask plate and improve display quality of the display apparatus.

Optionally, the semi-transparent region of the half tone mask plate corresponds to a partial or entire region of the third region having a gap with the second region.

In one embodiment of the present disclosure, this can avoid producing negative impact on electric performance of TFT manufactured by using the half tone mask plate.

Optionally, the half tone mask plate includes a totally light shielding region corresponding to the first region; and the semi-transparent region of the half tone mask plate corresponds to a partial or entire region of the third region having no gap with the first region.

In one embodiment of the present disclosure, the half tone mask plate is convenient to be manufactured so as to improve a production efficiency of the half tone mask plate.

Optionally, the semi-transparent region of the half tone mask plate corresponds to regions of the third region, which are located at two sides of the data line pattern and have no gap with the data line pattern.

One embodiment of the present disclosure provides an implementation of an exemplary position of the semi-transparent region of the half tone mask plate, so that one skilled in the art can easily realize the technical solution of the present disclosure. It should be noted, the specific position of the semi-transparent region of the half tone mask plate in one embodiment of the present disclosure is merely used to explain the present disclosure, and is not used to limit the present disclosure, other implementations which can be used to realize the technical solution of the present disclosure also fall within the scope of the present disclosure.

Optionally, the semi-transparent region of the half tone mask plate corresponds to regions of the third region, which are located at two sides of the data line pattern and have no gap with the data line pattern.

Optionally, the semi-transparent region of the half tone mask plate corresponds to a partial region of the third region, which is outside of the pixel display region, has a gap with the second region and has no gap with the first region.

Optionally, each independent region of the third region corresponding to the semi-transparent region of the half tone mask plate has a dimension value range from 0.5 microns to 1 micron in a direction perpendicular to the data line pattern.

One embodiment of the present disclosure provides an implementation of an exemplary size of the semi-transparent region of the half tone mask plate, so that one skilled in the art can easily realize the technical solution of the present disclosure. It should be noted, the specific size of the semi-transparent region of the half tone mask plate in one embodiment of the present disclosure is merely used to explain the present disclosure, and is not used to limit the present disclosure, other implementations which can be used to realize the technical solution of the present disclosure also fall within the scope of the present disclosure.

Optionally, the half tone mask plate further comprises a totally light transmitting region which corresponds to a region of the third region except for the region of the third region corresponding to the semi-transparent region of the half tone mask plate.

In a second aspect, one embodiment of the present disclosure provides a method for manufacturing an array substrate by using the above half tone mask plate, the method includes:

using the half tone mask plate to form an active layer pattern as well as a source electrode pattern, a drain electrode pattern and a data line pattern located on the active layer pattern of the array substrate through one time mask patterning process.

In one embodiment of the present disclosure, the semi-transparent region of the half tone mask plate corresponds to not only the second region, but also the partial region of the third region; the active layer pattern formed by using the half tone mask plate is usually rarely or not over-etched; there is usually little or no etched material remained between the source electrode pattern and the drain electrode pattern formed by using the half tone mask plate; thus, TFT including the active layer pattern, the source electrode pattern and the drain electrode pattern has a better performance, and the final manufactured array substrate also has a better quality.

Optionally, forming the active layer pattern as well as the source electrode pattern, the drain electrode pattern and the data line pattern located on the active layer pattern includes:

sequentially depositing a semiconductor layer and a metal layer;

coating photoresist on the metal layer;

using the half tone mask plate to expose and develop the photoresist to form a photoresist-totally-remained area, a photoresist-half-remained area and a photoresist-totally-removed area; wherein the photoresist-totally-remained area corresponds to the first region, and the photoresist-half-remained area corresponds to the second region and a partial region of the third region;

removing the semiconductor layer and the metal layer in the photoresist-totally-removed area by using an etching process;

removing the photoresist in the photoresist-half-remained area by using a plasma ashing process;

removing the metal layer in the photoresist-half-remained area by using an etching process; and peeling off the photoresist in the photoresist-totally-remained area.

One embodiment of the present disclosure provides an exemplary implementation of forming the active layer pattern, the source electrode pattern, the drain electrode pattern and the data line pattern, so that one skilled in the art can easily realize the technical solution of the present disclosure. It should be noted, the specific implementation of forming the active layer pattern, the source electrode pattern, the drain electrode pattern and the data line pattern in one embodiment of the present disclosure is merely used to explain the present disclosure, and is not used to limit the present disclosure, other implementations which can be used to realize the technical solution of the present disclosure also fall within the scope of the present disclosure.

Optionally, removing the metal layer in the photoresist-half-remained area by using the etching process comprises: removing the metal layer in the photoresist-half-remained area by using a drying etching process.

Optionally, before forming the active layer pattern as well as the source electrode pattern, the drain electrode pattern and the data line pattern located on the active layer pattern, the method further comprises: using a first mask plate to form a gate electrode pattern and a gate line pattern under the active layer pattern through one time mask patterning process.

Optionally, after forming the active layer pattern as well as the source electrode pattern, the drain electrode pattern and the data line pattern located on the active layer pattern, the method further comprises: using a second mask plate to form a signal guiding section via hole pattern located on the drain electrode pattern through one time mask patterning process; using a third mask plate to form a pixel electrode pattern electrically connected to the drain electrode pattern through the via hole through one time mask patterning process.

In a third aspect, one embodiment of the present disclosure provides an array substrate having a surface including a first region corresponding to a source electrode pattern, a drain electrode pattern and a data line pattern, a second region corresponding to a region of an active layer pattern located between the source electrode pattern and the drain electrode pattern, as well as a third region in addition to the first region and the second region, the array substrate includes:

the active layer pattern located at positions corresponding to the first region, the second region and a partial region of the third region; and the source electrode pattern, the drain electrode pattern and the data line pattern located on the active layer pattern corresponding to the first region.

One embodiment of the present disclosure provides a structure of an array substrate manufactured by using the half tone mask plate, and the array substrate of one embodiment of the present disclosure has a better quality.

In a fourth aspect, one embodiment of the present disclosure provides a display apparatus including the array substrate.

In one embodiment of the present disclosure, the display apparatus includes the array substrate manufactured by using the half tone mask plate, since the array substrate has a better quality, thus, the display apparatus also has a better quality.

Comparing with the prior art, the semi-transparent region of the half tone mask plate according to one embodiment of the present disclosure corresponds to not only the second region, but also the partial region of the third region; thus, after removing photoresist remained in the semi-transparent region of the half tone mask plate through an ashing process, etched material in both of the partial region of the third region and the second region are exposed, so that a contact area between the etched material and the etching plasma is increased, a etching rate is reduced and the etching uniformity is improved. This can reduce or avoid in a certain extent occurrence of problems that the etched material in the semi-transparent region of the half tone mask plate is remained or over-etched, improve the performance of the manufactured TFT and the quality of the final manufactured array substrate.

DETAILED DESCRIPTION

Figure 1:
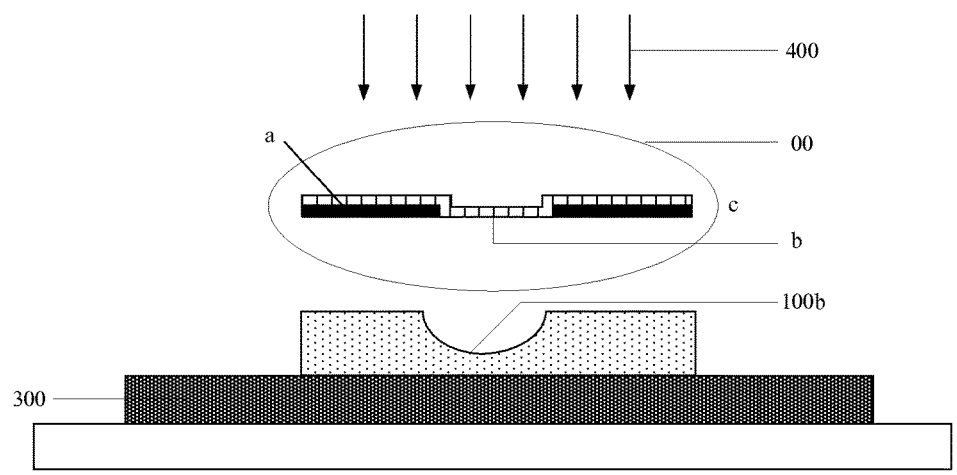
FIG. 1 is a schematic diagram showing a configuration of using a half tone mask plate to expose and develop photoresist in the prior art.

In an embodiment of the present disclosure, a surface of an array substrate includes a first region corresponding to a source electrode pattern, a drain electrode pattern and a data line pattern, a second region corresponding to a region of an active layer pattern located between the source electrode pattern and the drain electrode pattern, as well as a third region in addition to the first region and the second region. A semi-transparent region of a half tone mask plate corresponds to a partial region of the third region and the second region.

Comparing with the prior art, the semi-transparent region of the half tone mask plate according to one embodiment of the present disclosure corresponds to not only the second region, but also the partial region of the third region; thus, after removing photoresist remained in the semi-transparent region of the half tone mask plate by an ashing process, etched material in both of the partial region of the third region and the second region are exposed, so that a contact area between the etched material and etching plasma is increased, a etching rate is reduced and uniformity of the etching is improved. This can reduce or avoid in a certain extent occurrence of problems that the etched material in the semi-transparent region of the half tone mask plate is remained or over-etched, improve the performance of the manufactured TFT and the quality of the final manufactured array substrate.

Inventors notice that:

The dry etching method is a technique that uses etching plasma generated by a dry etching equipment to etch films.

When the dry etching method is used to etch a material, a size of an area of the etched material exposed in the plasma affects rate and uniformity of etching the etched material; the larger the size of the area of the etched material exposed in the plasma is, the smaller the rate of etching the etched material is, and the better the uniformity of etching the etched material is.

Embodiments of the present disclosure will be described hereinafter in conjunction with the drawings.

Optionally, a half tone mask plate provided in one embodiment of the present disclosure is used to manufacture an active layer pattern as well as a source electrode pattern, a drain electrode pattern and a data line pattern located on the active layer pattern included in an array substrate. A surface of the array substrate includes an first region corresponding to the source electrode pattern, the drain electrode pattern and the data line pattern, a second region corresponding to a region of the active layer pattern located between the source electrode pattern and the drain electrode pattern, as well as a third region in addition to the first region and the second region.

A semi-transparent region of the half tone mask plate corresponds to a partial region of the third region and the second region.

In implementation, the semi-transparent region of the half tone mask plate corresponds to not only the second region, but also the partial region of the third region; thus, after using the half tone mask plate to expose and develop photoresist on etched material, some photoresist is remained on the etched material in both of the partial region of the third region and the second region; after removing the remained photoresist by an ashing process, the etched material in both of the partial region of the third region and the second region are exposed.

Comparing with the prior art, when the dry etching method is used to etch the etched material in the semi-transparent region of the half tone mask plate, not only the exposed etched material in the second region contacts etching plasma generated by a dry etching equipment, but also the exposed etched material in the partial region of the third region contacts the etching plasma, i.e., an area of the etched material exposed in the etching plasma is increased. Thus, a rate of etching the etched material in the partial region of the third region and the second region is reduced, and the uniformity of etching the etched material in the partial region of the third region and the second region is improved. This can reduce or avoid in a certain extent occurrence of problems that the etched material in the semi-transparent region of the half tone mask plate is remained or over-etched, improve the performance of the manufactured TFT and the quality of the final manufactured array substrate.

It should be noted, in one embodiment of the present disclosure, when the dry etching method is used to etch the etched material (i.e., material that is used to form the source electrode pattern, the drain electrode pattern and the data line pattern) in the semi-transparent region of the half tone mask plate, an etching depth of the second region is the same as an etching depth of a region of the active layer located between the source electrode region and the drain electrode region in the prior art (the etching depth equals to a thickness of the source electrode corresponding to the source electrode region); an etching depth of the partial region of the third region is the same as the etching depth of the second region, and then the active layer pattern exists in the partial region of the third region.

Optionally, an implementation of the second region corresponding to the semi-transparent region of the half tone mask plate according to one embodiment of the present disclosure is similar to that of the region of the active layer region located between the source electrode region and the drain electrode region corresponding to the semi-transparent region of the half tone mask plate in the prior art, and will not be repeated here.

An implementation of the partial region of the third region corresponding to the semi-transparent region of the half tone mask plate according to one embodiment of the present disclosure will be described hereinafter.

Optionally, the semi-transparent region of the half tone mask plate corresponds to the partial region of the third region, i.e., an orthographic projection of the semi-transparent region of the half tone mask plate on a base substrate (of the array substrate) entirely coincides with an orthographic projection of the partial region of the third region on the base substrate (of the array substrate).

Optionally, the semi-transparent region of the half tone mask plate corresponds to any partial region of the third region.

In implementation, when the semi-transparent region of the half tone mask plate corresponds to any partial region of the third region, the area of the etched material exposed in the etching plasma can be increased so as to reduce etching rate and improve etching uniformity, achieving reducing or avoiding in a certain extent occurrence of problems that the etched material in the semi-transparent region of the half tone mask plate is remained or over-etched.

Optionally, the semi-transparent region of the half tone mask plate corresponds to at least one independent region (separate areas) of the third region.

Figure 2A:
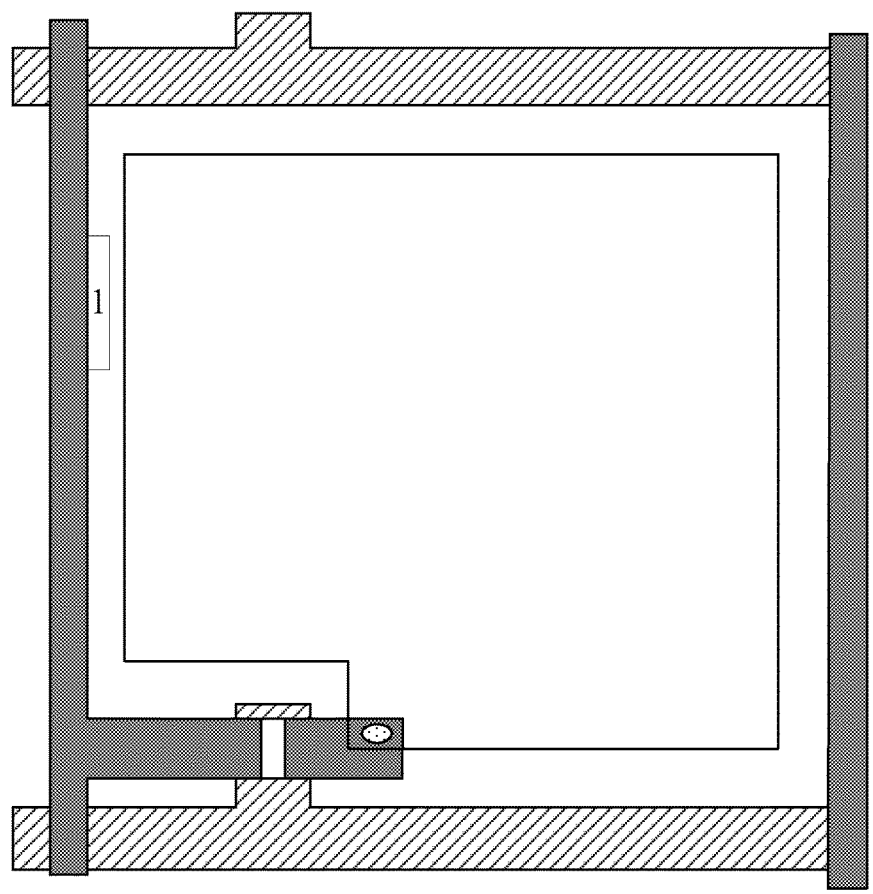
FIGS. 2A-2H are schematic diagrams showing corresponding relationships between semi-transparent regions of half tone mask plates and regions included in surfaces of array substrates according to embodiments of the present disclosure.

For example, as shown in FIG. 2A, a semi-transparent region of a half tone mask plate corresponds to an independent region 1 of the third region.

Figure 2B:
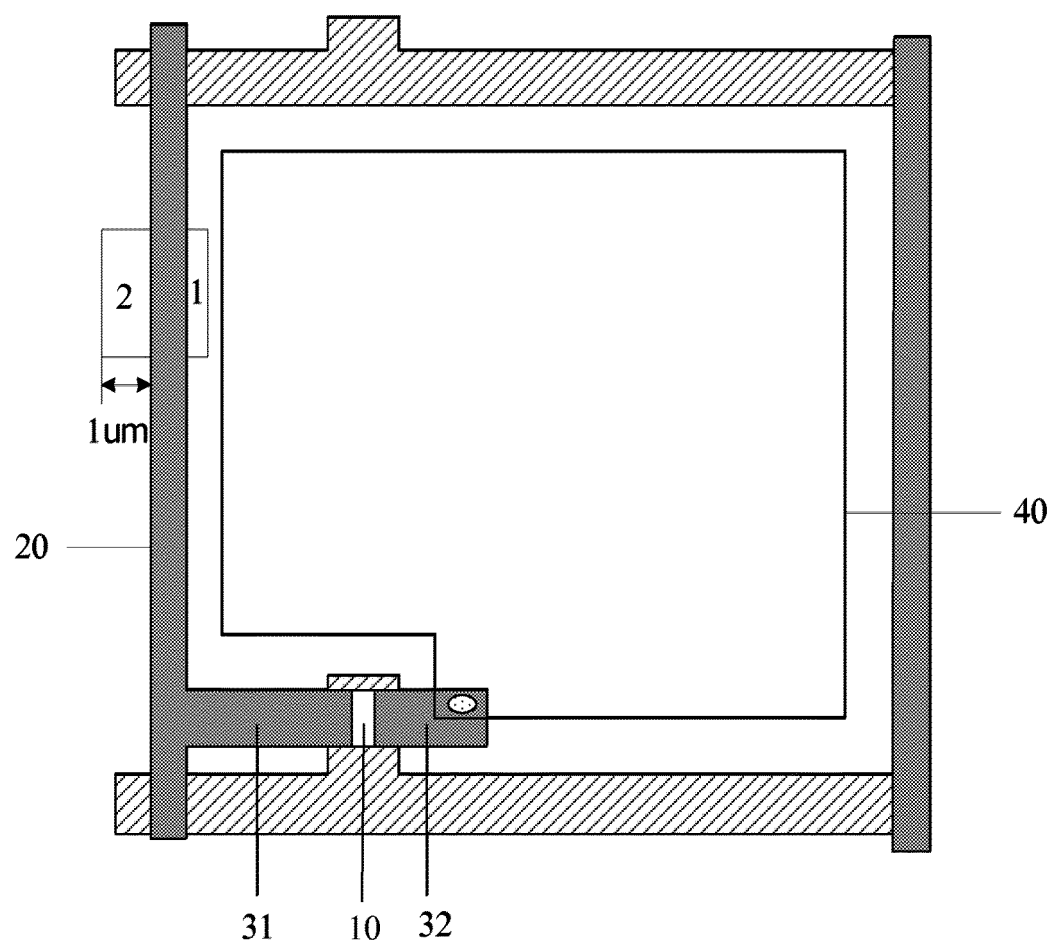

As shown in FIG. 2B, a semi-transparent region of a half tone mask plate corresponds to an independent region 1 and an independent region 2 of the third region.

Figure 2C:
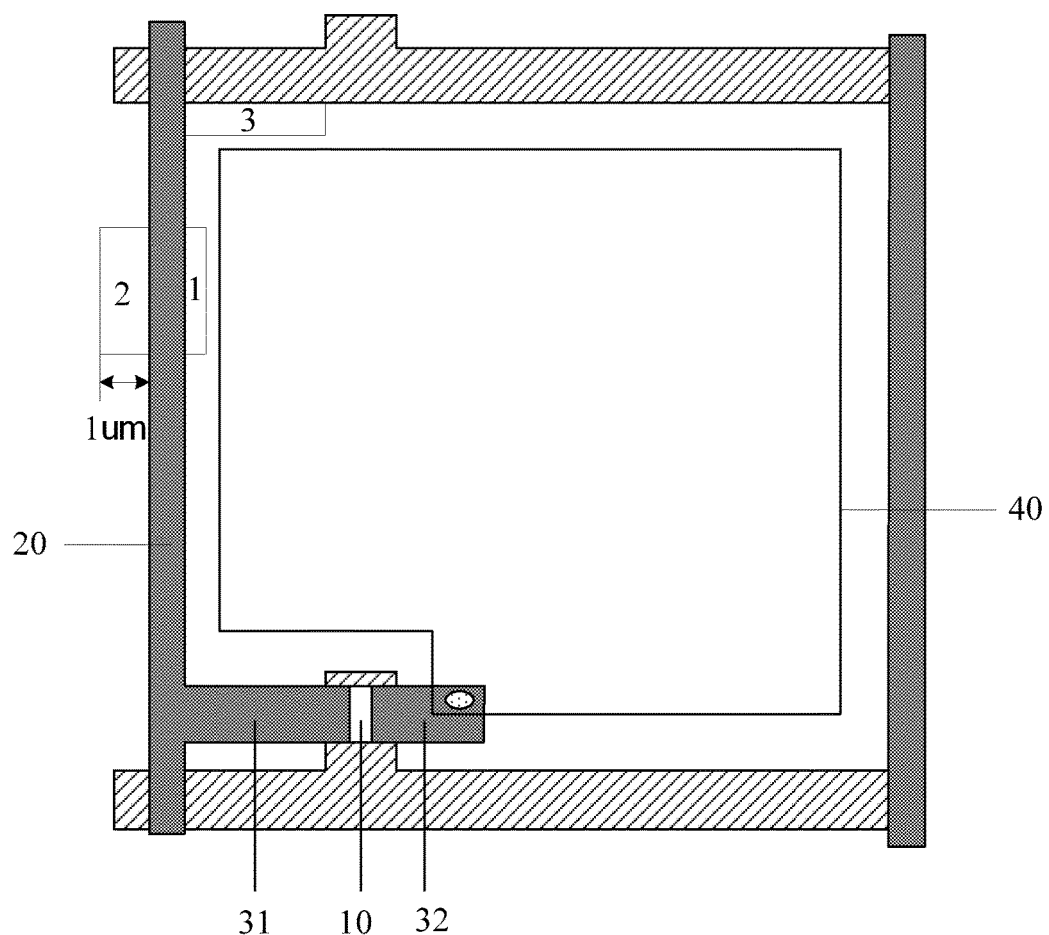

As shown in FIG. 2C, a semi-transparent region of a half tone mask plate corresponds to an independent region 1, an independent region 2 and an independent region 3 of the third region.

Figure 2D:
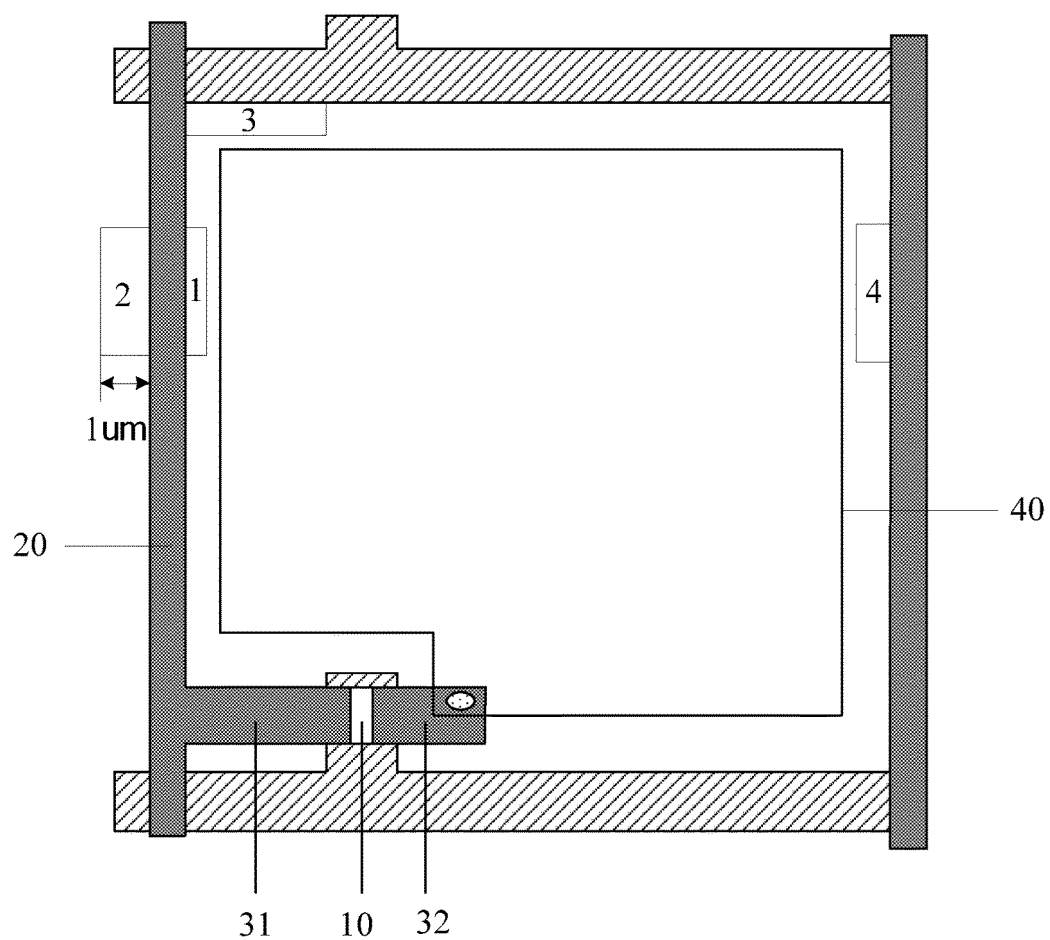

As shown in FIG. 2D, a semi-transparent region of a half tone mask plate corresponds to an independent region 1, an independent region 2, an independent region 3 and an independent region 4 of the third region.

It should be noted, the above implementations of FIGS. 2A-2D are merely used to illustrate embodiments of the present disclosure, but shall not be used to limit embodiments of the present disclosure.

Since an implementation of a position of each independent region of the third region corresponding to the semi-transparent region of the half tone mask plate is similar to each other. The implementation of the position of the independent region of the third region corresponding to the semi-transparent region of the half tone mask plate will be described hereinafter by taking an independent region (i.e., independent region e) of the third region corresponding to the semi-transparent region of the half tone mask plate as an example.

It should be noted, there is a plurality of kinds of implementations of the position of the independent region of the third region corresponding to the semi-transparent region of the half tone mask plate according to one embodiment of the present disclosure, and three exemplary implementations will be described hereinafter.

1. The independent region e is located in a region outside of a pixel display region of the third region.

Figure 2E:
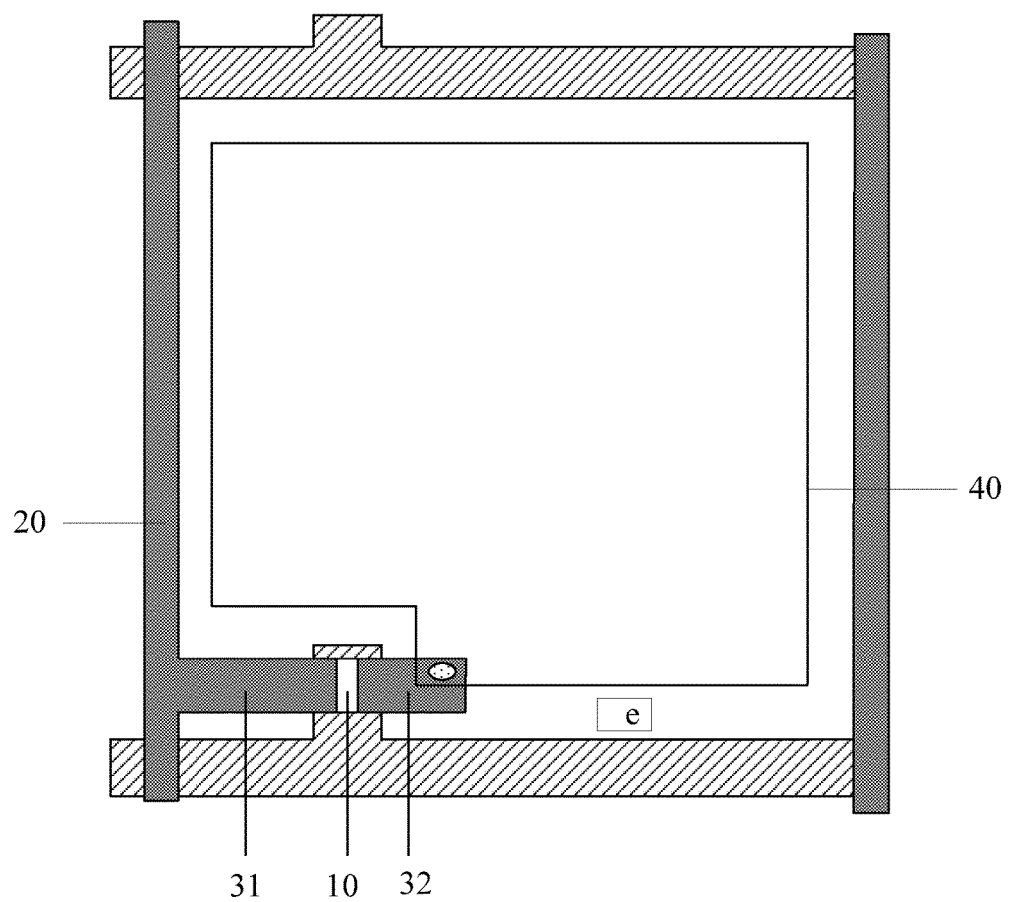

For example, as shown in FIG. 2E, the third region includes a pixel display region (i.e., a region enclosed by a pixel electrode pattern 40), and the independent region e is located in a region outside of the pixel display region of the third region.

Optionally, the semi-transparent region of the half tone mask plate corresponds to a partial or entire region of the third region except for the pixel display region; that is, each independent region of the third region corresponding to the semi-transparent region of the half tone mask plate is located in a region outside of the pixel display region.

In implementation, since the active layer pattern exists in the region of the third region corresponding to the semi-transparent region of the half tone mask plate, thus, making each independent region of the third region corresponding to the semi-transparent region of the half tone mask plate locate in a region outside of the pixel display region can ensure that a display apparatus manufactured through the half tone mask plate has a better display quality.

In specific implementation, in order to increase the area of the etched material exposed in the etching plasma so as to reduce the etching rate and improve the etching uniformity, the independent region e can also be located in a region within the pixel display region.

2. The independent region e is located in a region of the third region having a gap with the second region.

Figure 2F:
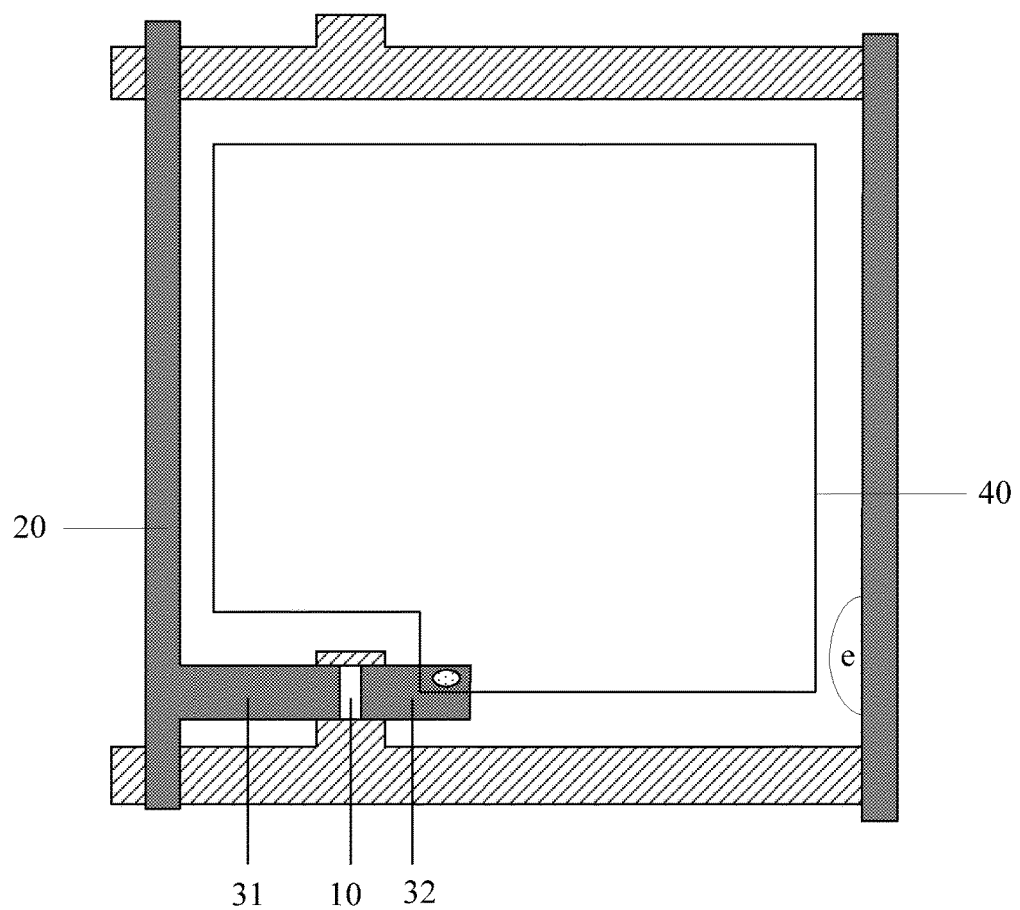

For example, as shown in FIG. 2F, the independent region e is located in the third region and has a certain gap with the second region.

Optionally, the semi-transparent region of the half tone mask plate corresponds to a partial or entire region of the third region having a gap with the second region; that is, each independent region of the third region corresponding to the semi-transparent region of the half tone mask plate is located in a region of the third region having a gap with the second region.

In implementation, since the active layer pattern exists in the region of the third region corresponding to the semi-transparent region of the half tone mask plate, thus, making each independent region of the third region corresponding to the semi-transparent region of the half tone mask plate locate in a region of the third region having a gap with the second region can ensure that TFT manufactured through the half tone mask plate has a better electric performance.

In specific implementation, a size of the gap between the independent region e and the second region can be set according to need or experience.

3. A totally light shielding region of the half tone mask plate corresponds to the first region, and the independent region e is located in a region of the third region having no gap with the first region.

Figure 2G:
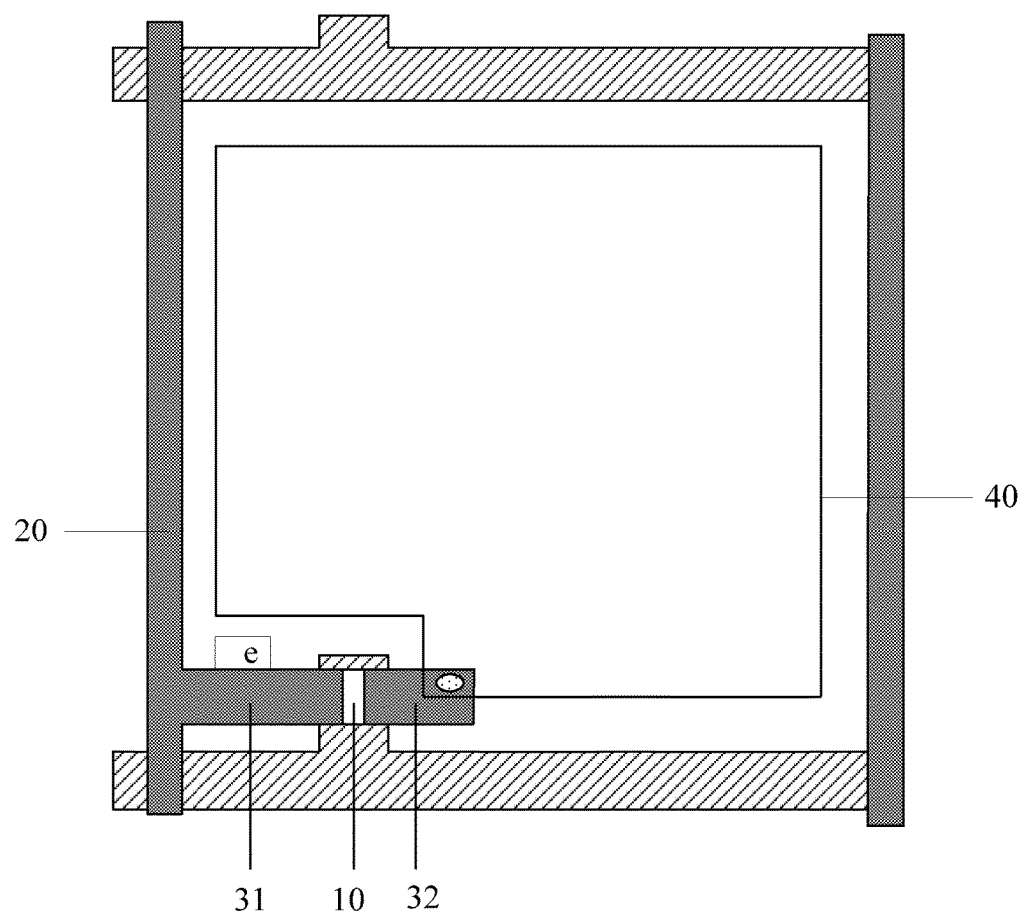

For example, as shown in FIG. 2G, the independent region e is located in the third region and has no gap with the first region.

Optionally, the semi-transparent region of the half tone mask plate corresponds to a partial or entire region of the third region having no gap with the first region; that is, each independent region of the third region corresponding to the semi-transparent region of the half tone mask plate is located in a region of the third region having no gap with the first region.

In implementation, since each independent region of the third region corresponding to the semi-transparent region of the half tone mask plate is located in a region of the third region having no gap with the first region, then there is no gap between the semi-transparent region and the totally light shielding region of the half tone mask plate, thus, the half tone mask plate is convenient to be manufactured and a production efficiency of the half tone mask plate is improved.

In specific implementation, the independent region e can also be located in a region of the third region having a gap with the first region, as shown in FIG. 2E.

It should be noted, the above three exemplary implementations related to positions of the independent region can be implemented separately, and can also be implemented in combination, which can be determined according to need.

Optionally, the above three exemplary implementations related to positions of the independent region can be implemented in combination.

Optionally, the semi-transparent region of the half tone mask plate corresponds to a region of the third region, which is located at two sides of the data line pattern and has no gap with the data line pattern.

For example, as shown in FIG. 2B, the semi-transparent region of the half tone mask plate corresponds to two independent regions of the third region, i.e., the independent region 1 and the independent region 2. The independent region 1 and the independent region 2 are located at two sides of the data line pattern 20, respectively, and have no gap with the data line pattern 20.

That is, the semi-transparent region of the half tone mask plate corresponds to a partial region of the third region, which is outside of the pixel display region, has a gap with the second region and has no gap with the first region.

Optionally, in one embodiment of the present disclosure, there is a plurality of kinds of implementations of a shape of one independent region (i.e., the independent region e) of the third region corresponding to the semi-transparent region of the half tone mask plate, for example, a regular shape or an irregular shape.

Optionally, a specific implementation of the shape of the independent region can be set according to experience or need.

Optionally, in one embodiment of the present disclosure, each independent region of the third region corresponding to the semi-transparent region of the half tone mask plate has a dimension value range from 0.5 microns to 1 micron in a direction perpendicular to the data line pattern.

In implementation, requirements of the dry etching method and quality requirements of the array substrate can be met.

It should be noted, the specific size of the semi-transparent region of the half tone mask plate in one embodiment of the present disclosure is merely used to explain the embodiment of the present disclosure, and is not used to limit the embodiment of the present disclosure; other implementations which can be used to realize the technical solution of one embodiment of the present disclosure also fall within the scope of the present disclosure. The gap according to one embodiment of the present disclosure can refer to a slot or a blank region.

Optionally, a totally light transmitting region of the half tone mask plate corresponds to a region of the third region except for the region of the third region corresponding to the semi-transparent region of the half tone mask plate; for example, if the semi-transparent region of the half tone mask plate corresponds to a fourth region of the third region, then the totally light transmitting region of the half tone mask plate corresponds to a region of the third region except for the fourth region.

Based on the same inventive concept, one embodiment of the present disclosure further provides a method for manufacturing an array substrate by using the half tone mask plate, the array substrate and a display apparatus. Because principles based on which the method for manufacturing an array substrate, the array substrate and the display apparatus solve the problems are similar to those of the half tone mask plate of one embodiment of the present disclosure, an implementation of the principles can refer to the implementation of the half tone mask plate of one embodiment of the present disclosure and will not be repeated here.

Optionally, one embodiment of the present disclosure provides a method for manufacturing an array substrate by using the half tone mask plate, and the method includes: using the half tone mask plate to form an active layer pattern of the array substrate as well as a source electrode pattern, a drain electrode pattern and a data line pattern located on the active layer pattern through one time mask patterning process.

In implementation, the semi-transparent region of the half tone mask plate corresponds to not only the second region, but also the partial region of the third region; the active layer pattern formed by using the half tone mask plate is rarely or not over-etched; there is usually little or no etched material remained between the source electrode pattern and the drain electrode pattern formed by using the half tone mask plate; thus, an TFT including the active layer pattern, the source electrode pattern and the drain electrode pattern has a better performance, and the final manufactured array substrate also has a better quality.

Optionally, forming the active layer pattern as well as the source electrode pattern, the drain electrode pattern and the data line pattern located on the active layer pattern specifically includes:

step A: sequentially depositing a semiconductor layer and a metal layer;

step B: coating photoresist on the metal layer;

step C: using the half tone mask plate to expose and develop the photoresist to form a photoresist-totally-remained area, a photoresist-half-remained area and a photoresist-totally-removed area; the photoresist-totally-remained area corresponding to the first region, and the photoresist-half-remained area corresponding to the partial region of the third region and the second region;

step D: removing the semiconductor layer and the metal layer in the photoresist-totally-removed area by using an etching process;

step E: removing the photoresist in the photoresist-half-remained area by using a plasma ashing process;

step F: removing the metal layer in the photoresist-half-remained area by using an etching process;

step G: peeling off the photoresist in the photoresist-totally-remained area.

In specific implementation, after the step G, the active layer pattern as well as the source electrode pattern, the drain electrode pattern and the data line pattern located on the active layer pattern which are sequentially stacked, are formed.

In implementation, in the step F, the metal layer (i.e., etched material) in both of the partial region of the third region and the second region contacts etching plasma.

Comparing with the prior art, an area of the metal layer exposed in the etching plasma is increased, thus, the etching rate is reduced, and the etching uniformity is improved in a certain extent. This can reduce or avoid in a certain extent occurrence of problems that the metal layer in the semi-transparent region of the half tone mask plate is remained on or over-etched to the semiconductor layer, improve the performance of the manufactured TFT which includes the active layer pattern, the source electrode pattern and the drain electrode pattern, and improve the quality of the final manufactured array substrate.

Optionally, in the step A, the semiconductor layer is a film layer which is used to form the active layer pattern; the metal layer is a film layer which is used to form the source electrode pattern, the drain electrode pattern and the data line pattern.

In specific implementation, in the step A, the metal layer can also be other non-metal conductive film layer which can be used to form the source electrode pattern, the drain electrode pattern and the data line pattern.

Optionally, in the step F, removing the metal layer in the photoresist-half-remained area by using the etching process includes:

removing the metal layer in the photoresist-half-remained area by using a drying etching process.

In implementation, since a dry etching equipment which can implements the drying etching process can also have a function of ashing and removing the photoresist at the same time, thus, both of the step E and the step F can be implemented by the dry etching equipment, thereby simplifying the processes.

Optionally, before forming the active layer pattern as well as the source electrode pattern, the drain electrode pattern and the data line pattern located on the active layer pattern, the method further includes:

using a first mask plate to form a gate electrode pattern and a gate line pattern under the active layer pattern through one time mask patterning process.

Optionally, after forming the active layer pattern as well as the source electrode pattern, the drain electrode pattern and the data line pattern located on the active layer pattern, the method further includes:

using a second mask plate to form a signal guiding section via hole pattern located on the drain electrode pattern through one time mask patterning process;

using a third mask plate to form a pixel electrode pattern electrically connected to the drain electrode pattern through the via hole through one time mask patterning process.

The implementation of using the half tone mask plate of one embodiment of the present disclosure to form the active layer pattern of the array substrate as well as the source electrode pattern, the drain electrode pattern and the data line pattern located on the active layer pattern will be described in details hereinafter in conjunction with two embodiments.

First Embodiment

In the first embodiment of the present disclosure, the semi-transparent region of the half tone mask plate corresponds to regions of the third region, which are located at two sides of the data line pattern and have no gap with the data line pattern.

As shown in FIG. 2B, a surface of an array substrate includes an first region corresponding to a source electrode pattern 31, a drain electrode pattern 32 and the data line pattern 20, a second region corresponding to a region of an active layer pattern 10 located between the source electrode pattern 31 and the drain electrode pattern 32, as well as a third region in addition to the first region and the second region.

The semi-transparent region of the half tone mask plate corresponds to an independent region 1 and an independent region 2 of the third region. The independent region 1 and the independent region 2 are located at two sides of the data line pattern 20, respectively. The independent region 1 is located between the data line pattern 20 and the pixel electrode pattern 40. There is no gap between the data line pattern 20 and each of the independent region 1 and the independent region 2. The independent region 1 and the independent region 2 each are in a rectangle shape. A width of the independent region 1 is 0.5 microns. A width of the independent region 2 is 1 micron.

The implementation of forming the active layer pattern as well as the source electrode pattern, the drain electrode pattern and the data line pattern located on the active layer pattern will be described hereinafter by taking the half tone mask plate shown in FIG. 2B as an example.

Optionally, forming the active layer pattern as well as the source electrode pattern, the drain electrode pattern and the data line pattern located on the active layer pattern specifically includes:

step A1: sequentially depositing a semiconductor layer and a metal layer on a base substrate;

step A2: coating photoresist on the metal layer;

step A3: using the half tone mask plate to expose and develop the photoresist to form a photoresist-totally-remained area, a photoresist-half-remained area and a photoresist-totally-removed area; the photoresist-totally-remained area corresponding to the first region, and the photoresist-half-remained area corresponding to the partial region of the third region and the second region;

The totally light shielding region of the half tone mask plate corresponds to the photoresist-totally-remained area. The semi-transparent region of the half tone mask plate corresponds to the photoresist-half-remained area. The totally light transmitting region of the half tone mask plate corresponds to the photoresist-totally-removed area.

Figure 3A:
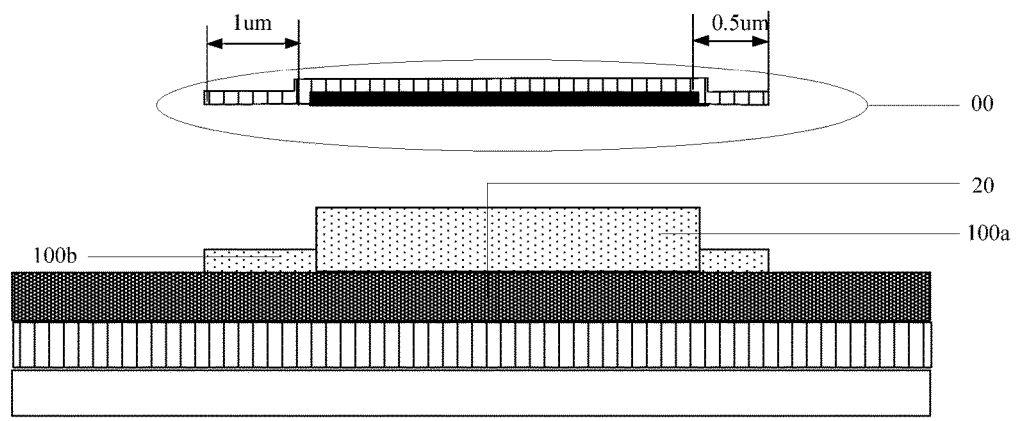
FIGS. 3A-3C are schematic diagrams showing a structure of a data line pattern during a process of manufacturing an array substrate according to an embodiment of the present disclosure.

As shown in FIG. 3A, a region of the half tone mask plate 00 corresponding to the data line pattern 20 is the totally light shielding region, thus, the photoresist 100a in a region corresponding to the data line pattern 20 is totally remained.

Regions of the half tone mask plate 00 which are located at two sides of the data line pattern 20 and have no gap with the data line pattern 20 (i.e., the independent region 1 and the independent region 2 shown in FIG. 2B), are the semi-transparent region, thus, the photoresist 100b in regions corresponding to the regions of the half tone mask plate 00 is partially remained.

Figure 3B:
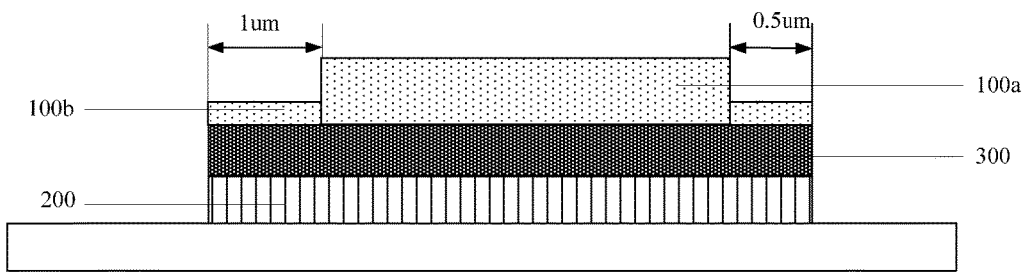
Figure 3C:
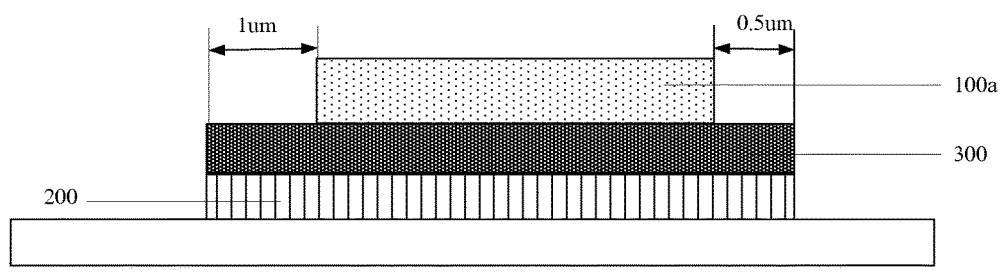

The totally light transmitting region and the semi-transparent region of the half tone mask plate 00 are adjacent to each other and have no gap therebetween; there is no photoresist in regions which are adjacent to the photoresist 100b and have no gap with the photoresist 100b.

step A4: removing the semiconductor layer and the metal layer in the photoresist-totally-removed area by using an etching process;

As shown in FIG. 3B, the semiconductor layer 200 and the metal layer 300 in the photoresist-totally-removed area (i.e., areas which are not covered by the photoresist) are etched; the semiconductor layer 200 and the metal layer 300 in regions corresponding to the photoresist 100a and the photoresist 100b are not etched.

step A5: removing the photoresist in the photoresist-half-remained area by using a plasma ashing process;

As shown in FIG. 3C, the photoresist 100b is removed, and the photoresist 100a is not removed.

Step A6: removing the metal layer in the photoresist-half-remained area by using a dry etching process;

Since the metal layer (i.e., the metal layer which is not covered by the photoresist 100a in FIG. 3C) in the regions of the third region, which are located at two sides of the data line pattern and have no gap with the data line pattern, is also exposed in the etching plasma, thus, comparing with the prior art, an area of the metal layer exposed in the etching plasma is increased, which reduces the etching rate and improves uniformity of the dry etching.

Step A7: peeling off the photoresist in the photoresist-totally-remained area.

Second Embodiment

In the second embodiment of the present disclosure, the drain electrode pattern is connected to the data line pattern; the semi-transparent region of the half tone mask plate corresponds to regions of the third region which are adjacent to the data line pattern and have no gap with the data line pattern, as well as regions of the third region which are adjacent to the drain electrode pattern and have no gap with the drain electrode pattern.

Figure 2H:
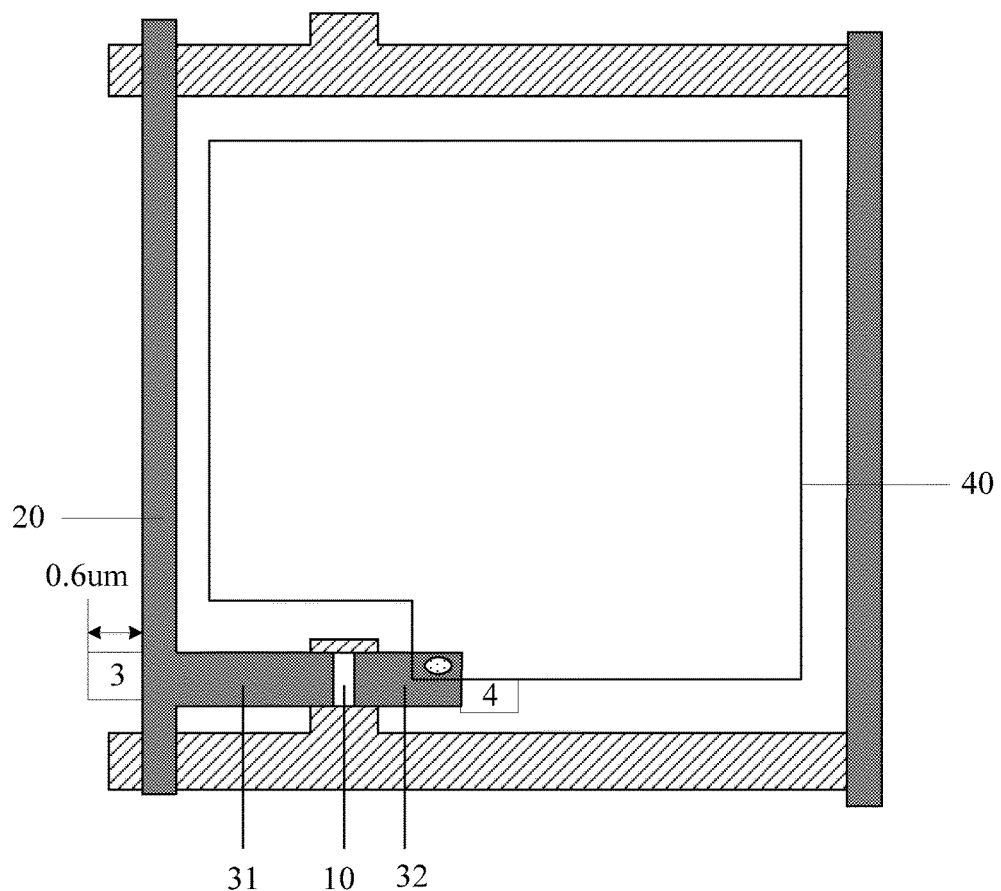

As shown in FIG. 2H, a surface of an array substrate includes an first region corresponding to a source electrode pattern 31, a drain electrode pattern 32 and the data line pattern 20, a second region corresponding to a region of an active layer pattern 10 located between the source electrode pattern 31 and the drain electrode pattern 32, as well as a third region in addition to the first region and the second region.

The semi-transparent region of the half tone mask plate corresponds to an independent region 3 and an independent region 4 of the third region. The independent region 3 is adjacent to the data line pattern 20 and has no gap with the data line pattern 20. The independent region 4 is adjacent to the drain electrode pattern and has no gap with the drain electrode pattern. The independent region 3 and the independent region 4 each are in a rectangle shape. A width of the independent region 3 is 0.5 microns. A width of the independent region 4 is 0.8 microns.

The implementation of forming the active layer pattern as well as the source electrode pattern, the drain electrode pattern and the data line pattern located on the active layer pattern will be described hereinafter by taking the half tone mask plate shown in FIG. 2H as an example.

Optionally, forming the active layer pattern as well as the source electrode pattern, the drain electrode pattern and the data line pattern located on the active layer pattern specifically includes:

step B1: sequentially depositing a semiconductor layer and a metal layer on a base substrate;

step B2: coating photoresist on the metal layer;

step B3: using the half tone mask plate to expose and develop the photoresist to form a photoresist-totally-remained area, a photoresist-half-remained area and a photoresist-totally-removed area; the photoresist-totally-remained area corresponding to the first region, and the photoresist-half-remained area corresponding to the partial region of the third region and the second region;

The totally light shielding region of the half tone mask plate corresponds to the photoresist-totally-remained area. The semi-transparent region of the half tone mask plate corresponds to the photoresist-half-remained area. The totally light transmitting region of the half tone mask plate corresponds to the photoresist-totally-removed area.

Figure 4A:
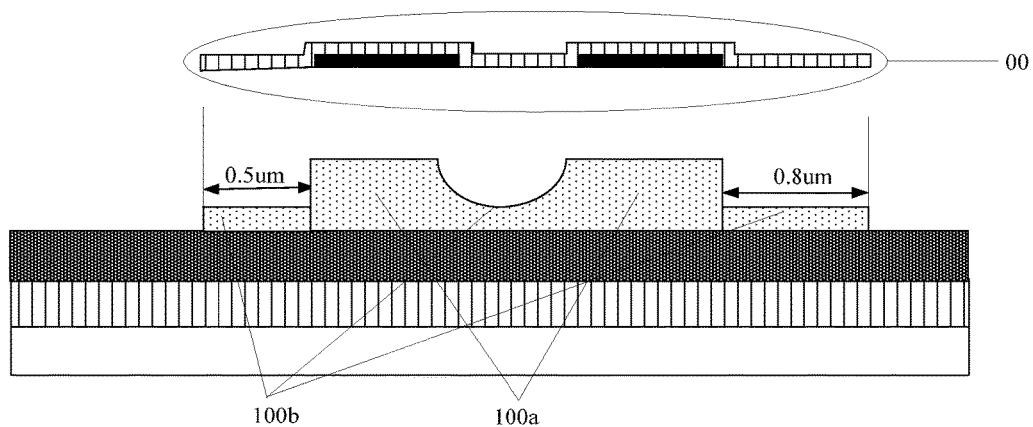
FIGS. 4A-4C are schematic diagrams showing structures of a source electrode pattern, a drain electrode pattern and the data line pattern during the process of manufacturing the array substrate according to an embodiment of the present disclosure.

As shown in FIG. 4A, a region of the half tone mask plate 00 corresponding to the source electrode pattern, the data line pattern and the drain electrode pattern is the totally light shielding region, thus, the photoresist 100a in a region corresponding to the source electrode pattern, the data line pattern and the drain electrode pattern is totally remained.

Regions of the half tone mask plate 00 corresponding to the region (i.e., the second region) of the active layer pattern between the source electrode pattern and the drain electrode pattern, a region (i.e., the independent region 3) adjacent to the data line pattern and having no gap with the data line pattern, as well as a region (i.e., the independent region 4) adjacent to the drain electrode pattern and having no gap with the drain electrode pattern, are the semi-transparent region, thus, the photoresist 100b in regions corresponding to the regions of the half tone mask plate 00 is partially remained.

The totally light transmitting region and the semi-transparent region of the half tone mask plate 00 are adjacent to each other and have no gap therebetween; there is no photoresist in regions which are adjacent to the photoresist 100b and have no gap with the photoresist 100b.

Figure 4B:
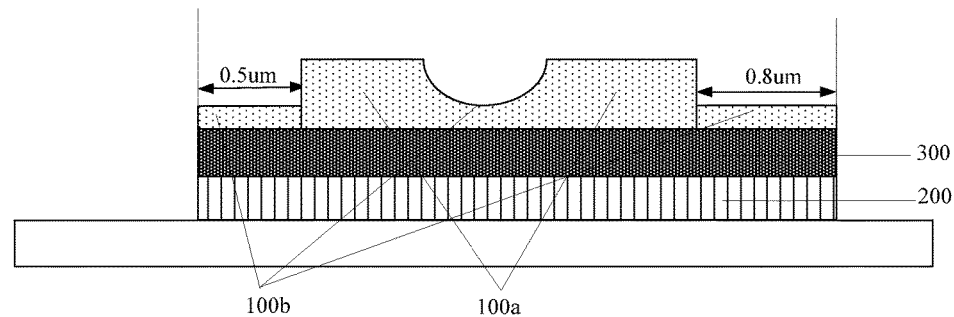
Figure 4C:
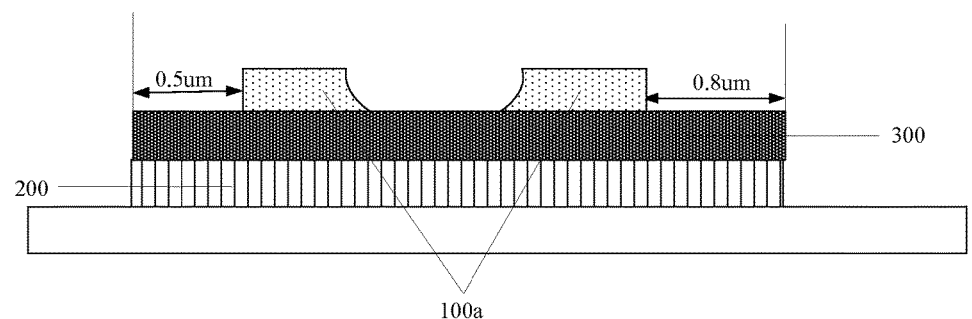

Step B4: removing the semiconductor layer and the metal layer in the photoresist-totally-removed area by using an etching process;

As shown in FIG. 4B, the semiconductor layer 200 and the metal layer 300 in the photoresist-totally-removed area (i.e., areas which are not covered by the photoresist) are etched; the semiconductor layer 200 and the metal layer 300 in regions corresponding to the photoresist 100a and the photoresist 100b are not etched.

step B5: removing the photoresist in the photoresist-half-remained area by using a plasma ashing process;

As shown in FIG. 4C, the photoresist 100b is removed, and the photoresist 100a is not removed.

Step B6: removing the metal layer in the photoresist-half-remained area by using a dry etching process;

As shown in FIG. 4C, in addition that the second region is exposed in the etching plasma, the regions of the third region which are adjacent to the data line pattern and have no gap with the data line pattern, as well as regions of the third region which are adjacent to the drain electrode pattern and have no gap with the drain electrode pattern are also exposed in the etching plasma, thus, comparing with the prior art, an area of the metal layer exposed in the etching plasma is increased, which reduces the etching rate of the drying etching and improves uniformity of the dry etching.

Step B7: peeling off the photoresist in the photoresist-totally-remained area.

Optionally, one embodiment of the present disclosure provides an array substrate. A surface of the array substrate includes a first region corresponding to a source electrode pattern, a drain electrode pattern and the data line pattern, a second region corresponding to a region of an active layer pattern located between the source electrode pattern and the drain electrode pattern, as well as a third region in addition to the first region and the second region.

The array substrate includes:

an active layer pattern located at a partial region of the third region, the first region and the second region; and the source electrode pattern, the drain electrode pattern and the data line pattern located on the active layer pattern corresponding to the first region.

It should be noted, in one embodiment of the present disclosure, the active layer pattern refers to a semiconductor film pattern, which is located below a film layer in which the source electrode pattern, the drain electrode and the data line pattern are located and which is located above the gate electrode pattern and the gate line pattern, after the array substrate is manufactured.

In implementation, when the dry etching method is used to etch the etched material (i.e., material that is used to form the source electrode pattern, the drain electrode pattern and the data line pattern) in the semi-transparent region of the half tone mask plate, an etching depth of the second region is the same as an etching depth of a region of the active layer region located between the source electrode region and the drain electrode region in the prior art (the etching depth equals to a thickness of the source electrode corresponding to the source electrode region); an etching depth of the partial region of the third region is the same as the etching depth of the second region, and then the active layer pattern exists in the partial region of the third region.

Optionally, one embodiment of the present disclosure provides a display apparatus which includes the array substrate.

The display apparatus can be any products or components having a display function such as a liquid crystal panel, an electronic paper, an OLED panel, a mobile phone, a panel computer, a television, a monitor, a notebook computer, a digital photo frame, a navigating instrument, and so on.

Although exemplary embodiments of the present disclosure have been described, once those skilled in the art learn the basic creative concept, they may make other modifications and alterations to these embodiments. Thus, the appended claims intend to be construed as covering the exemplary embodiments and all modifications and alterations which fall within the scope of the present disclosure.

Obviously, those skilled in the art may make some modifications and alterations to the embodiments of the present disclosure without departing from the basic concept and the scope of the present disclosure. Thus, if these modifications and alterations to the embodiments of the present disclosure fall within the scope of the claims of the present disclosure and their equivalent technology, then the present disclosure also intends to cover these modifications and alterations.

What is claimed is:

1. A half tone mask plate comprising:
   a totally light shielding region; and
   a semi-transparent region;
   wherein the semi-transparent region comprises a first semi-transparent sub-region and a second semi-transparent sub-region;
   wherein the first semi-transparent sub-region comprises two opposite sides in direct connection with the totally light shielding region;
   wherein the second semi-transparent sub-region is separated from the first semi-transparent sub-region;
   wherein at most one side of the second semi-transparent sub-region is in direct connection with the totally light shielding region;
   wherein the half tone mask plate further comprises a totally light transmitting region;
   wherein except for the at most one side of the second semi-transparent sub-region, other sides of the second semi-transparent sub-region are surrounded by the totally light transmitting region; and
   wherein the other sides of the second semi-transparent sub-region are in direct contact with the totally light transmitting region.

2. The half tone mask plate according to claim 1, wherein all sides of the second semi-transparent sub-region are surrounded by the totally light transmitting region and all sides of the second semi-transparent sub-region are in direct contact with the totally light transmitting region.

3. The half tone mask plate according to claim 1, wherein other sides of the second semi-transparent sub-region faces the totally light transmitting region.

4. The half tone mask plate according to claim 1, wherein other sides of the second semi-transparent sub-region are directly adjacent to the totally light transmitting region.

5. The half tone mask plate according to claim 2, wherein all sides of the second semi-transparent sub-region faces the totally light transmitting region.

6. The half tone mask plate according to claim 2, wherein all sides of the second semi-transparent sub-region are directly adjacent to the totally light transmitting region.

* * * * *